United States Patent

Steckler

[15] 3,701,032

[45] Oct. 24, 1972

[54] ELECTRONIC SIGNAL AMPLIFIER

[72] Inventor: Steven Alan Steckler, Clark, N.J.

[73] Assignee: RCA Corporation

[22] Filed: Feb. 16, 1971

[21] Appl. No.: 115,472

[52] U.S. Cl. ........................330/18, 330/28, 330/32, 330/38 M

[51] Int. Cl. ................................................H03f 3/42

[58] Field of Search........330/17, 18, 32, 38 R, 38 M, 330/28

[56] References Cited

OTHER PUBLICATIONS

Oswald " Class B Emitter Follower," IBM Technical Disclosure Bulletin Vol. 8, No. 10 1966, pp. 1447, 1448

*Primary Examiner*—Roy Lake
*Assistant Examiner*—James B. Mullins
*Attorney*—Eugene M. Whitacre

[57] ABSTRACT

Semiconductor voltage follower arrangements adapted for construction in integrated circuit form. A load circuit is coupled to the emitter of a voltage follower transistor. Operating potential is supplied to the collector of the follower transistor via the base-emitter circuit of a second transistor arranged in a common emitter transistor. The collector-emitter circuit of a regulator transistor is coupled across the load circuit. Feedback is provided from the output of the common emitter transistor to the input of the regulator transistor such that the collector current of the follower transistor is substantially independent of input voltage variations applied to the base of the follower transistor.

15 Claims, 2 Drawing Figures

Figure 1:
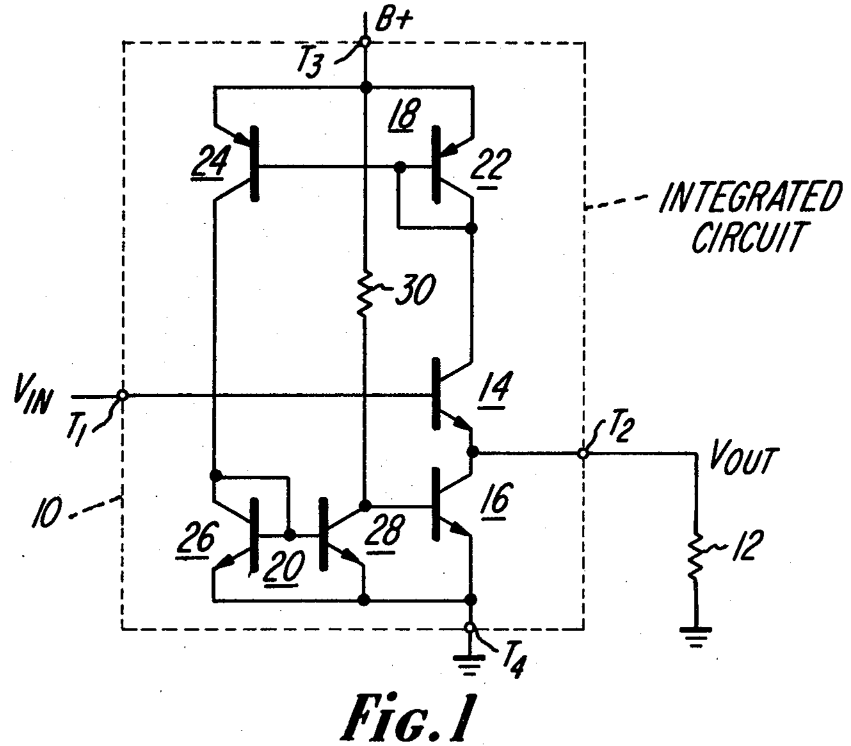

INVENTOR.
Steven A. Steckler
BY
Kenneth R. Schaefer
ATTORNEY

ELECTRONIC SIGNAL AMPLIFIER

This invention relates to electronic signal amplifier circuits and, in particular, to linear voltage "follower" arrangements particularly suited for fabrication in integrated circuit form.

As used herein, the term integrated circuit refers to a plurality of interconnected active and passive circuit elements such as transistors, diodes, resistors, and capacitors, formed, for example, in and on a substrate of semiconductor material such as silicon.

In the design of electrical circuits, it is frequently necessary to couple signals from a relatively high impedance source to a relatively low impedance load. In such a case, an arrangement such as an emitter follower may be used to provide the desired impedance match. Emitter followers or the like are also characterized as providing substantially unity voltage gain but significant current or power gain. Where it is desired to provide a substantially constant current gain for low input signal levels approaching the forward base-emitter conduction threshold ($V_{BE}$) of a transistor, the emitter follower is often inadequate and resort may then be had to a feedback follower arrangement of the type shown in U.S. Pat. No. 3,310,731, entitled "Voltage Reference Circuit," which is assigned to the same assignee as the present invention. Feedback followers of that type employ, for example, a resistor and the collector-emitter paths of two transistors connected in that order across an operating voltage supply. Input signals are applied to the base of the first transistor and output signals are obtained from the junction of the emitter of the first and the collector of the second transistor. Direct current feedback is provided between the collector of the first and the base of the second transistor by a level shifting circuit such as an avalanche diode and a resistor. This arrangement provides a particularly linear relationship between input and output voltages over a wide range of signal levels. Certain aspects of this general type of circuit configuration are also set forth in my co-pending U.S. Pat. application, Ser. No. 888,391, filed Dec. 29, 1969 wherein a differential follower arrangement is described. As is noted in the latter application, feedback follower arrangements of this type are useful in integrated circuits. It is desirable, however, when employing integrated circuit technology, to minimize the number of relatively large (and therefore space-consuming) resistors as well as to use as few separate collector isolations as possible (again to save area on the integrated circuit chip).

Furthermore, characteristics of devices employed in present day integrated circuits limit such circuits to operation from relatively low level voltage supplies. It is therefore desirable, to provide circuit means whereby the maximum output voltage swing from the follower approximates the supply voltage.

In accordance with the present invention, an electronic signal amplifier comprises a first transistor arranged as a voltage follower. A load circuit is coupled to the emitter and a source of input signals is coupled to the base of the voltage follower transistor. A source of operating potential is coupled to the collector of the follower transistor by means including the emitter-base circuit of a second transistor arranged in a common emitter configuration. Third and fourth transistors arranged, for example, as cascaded common emitter stages are coupled in a feedback path between the collector of the second transistor and the emitter of the first transistor to maintain collector current of the follower transistor substantially independent of input signal variations.

Figure 2:
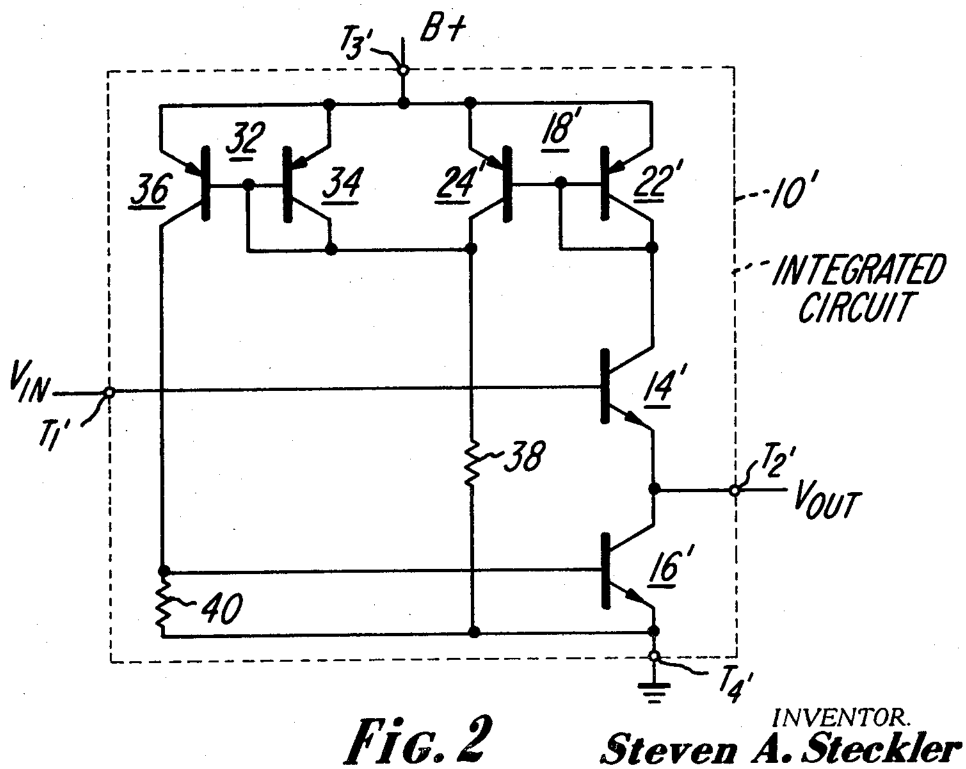

The novel features that are considered characteristic of this invention are set forth with particularity in the appended claims. The invention itself, however, both as to its organization and method of operation, as well as objects and advantages, will best be understood from the following description when read in connection with the accompanying drawing in which:

FIG. 1 is a schematic circuit diagram of a feedback follower amplifier adapted for construction in integrated circuit form embodying the present invention; and FIG. 2 is a schematic circuit diagram of a modified feedback follower amplifier adapted for construction in integrated circuit form embodying the invention.

Referring to FIG. 1 of the drawing, an amplifier capable of providing output voltage linearly related to input voltage is shown. The illustrated amplifier is particularly adapted for construction on an integrated circuit chip 10 indicated by the dashed outline. An input terminal $T_1$ and an output terminal $T_2$ are provided on chip 10 and are adapted for connection, respectively, to a signal source (not shown) and to a load, shown for illustrative purposes as an external resistor 12. The source and/or load 12 may, in certain applications, also be within the confines of chip 10. An operating voltage ($B^+$) supply terminal $T_3$ and a reference (ground) terminal $T_4$ are also provided on chip 10.

Input signals are coupled via terminal $T_1$ to the base of a follower transistor 14, the emitter of which is direct coupled to load 12 via output terminal $T_2$. The collector-emitter path of a variable load or shunt regulator transistor 16, of the same type conductivity as transistor 14 and arranged in a common emitter configuration, is also coupled across resistor 12 (i.e., between terminals $T_2$ and $T_4$).

Feedback is provided between the collector of follower transistor 14 and the base of regulator transistor 16 by means of first and second current repeater or "-current mirror" arrangements 18 and 20. Each of the current repeaters 18 and 20 comprises a combination of active semi-conductor devices having characteristics so matched as to provide a substantially constant current gain between input and output terminals of the repeater. Specifically, in the illustrated arrangement, where follower and regulator transistors 14 and 16 are of the NPN type, current repeater 18 comprises a diode-connected PNP transistor 22 having a base electrode direct coupled to its collector and to the collector of transistor 14 and an emitter electrode direct coupled to the operating voltage supply terminal $T_3$. Repeater 18 further comprises an output PNP transistor 24 arranged in a common emitter configuration. Transistor 24 includes base and emitter electrodes directly connected to corresponding electrodes of transistor 22 and a collector electrode from which output current is derived. Transistors 22 and 24 exhibit proportionally related conduction characteristics and are in close thermal proximity on chip 10. Considering the case where transistors 22 and 24 are of substantially identical geometry, current repeater 18 will serve to produce a current at the collector of transistor 24 which is substantially equal to the collector current of follower transistor 14 (i.e., current repeater 18 provides substantially unity current gain).

Current repeater 20, like repeater 18, comprises a diode-connected transistor 26 and a common emitter amplifier transistor 28 having their base-emitter junctions connected in parallel. Transistors 26 and 28 are, however, of the NPN type. The bases of transistors 26 and 28 are connected to the collector of transistor 26 and to the collector of transistor 24. The joined emitters of transistors 26 and 28 are connected to reference terminal $T_4$. The collector of common emitter transistor 28 is connected to the base of regulator transistor 16 and is also coupled via a resistor 30 to supply terminal $T_3$.

Transistors 26 and 28 are in close thermal proximity on chip 10 and exhibit proportionally related conduction characteristics. For the case where transistors 26 and 28 are of like geometry, repeater 20 will exhibit substantially unity current gain. When repeaters 18 and 20 are each arranged to provide unity current gain, the collector current of transistor 28 will be substantially equal to the collector current of transistor 14.

In the following description of the operation of the circuit of FIG. 1, it will be assumed, for purposes of explanation, that the illustrated transistors exhibit sufficient current gain ( $\beta$ ) that the base current of a particular transistor may be considered negligible in comparison to a corresponding collector current. Furthermore, it will be assumed that each of current repeaters 18 and 20 provides substantially unity current gain.

Input signals may be either a-c coupled (e.g., via a capacitor, not shown) to terminal $T_1$, in which case appropriate forward bias would be supplied to the base of transistor 14 by a conventional bias supply, or alternatively, input signals may be d-c coupled to terminal $T_1$. The latter case will be described.

When the input signal voltage supplied to terminal $T_1$ is of the order of the forward conduction base-emitter offset voltage ($V_{BE}$) associated with transistor 14, collector current flows in transistor 14 and is coupled to current repeater 18. As a result of the operation of the parallel connected base-emitter junction of diode-connected transistor 22 and common emitter transistor 24, the collector of transistor 14 is maintained at a voltage ($B^+ - V_{BE22}$) which is relatively invariant with input signal variations.

The collector current of transistor 14, which is associated with the above-noted collector voltage, is translated by current repeaters 18 and 20 and a substantially equal current component appears in resistor 30. It should be noted that the end of resistor 30 remote from terminal $T_3$, and the collector of transistor 28 as well, is maintained at a voltage level equal to the base-emitter offset voltage of regulator transistor 16 ($V_{BE16}$).

In addition to the collector current of transistor 28, the base-emitter current of regulator transistor 16 is also supplied from the $B^+$ supply via resistor 30. The total current in resistor 30 ($I_{30}$) may be expressed in terms of the voltage difference across resistor 30 ($B^+ - V_{BE16}$) divided by its resistance ($R_{30}$).

The base-emitter current of regulator transistor 16 is related to its collector current according to the current gain of the device and, as noted above, may be considered to be negligible relative to such collector current. The resulting collector current of regulator transistor 16, for the condition of a one $V_{BE}$ input signal at terminal $T_1$, is substantially equal to the collector-emitter current of follower transistor 14. Therefore no current flows in resistor 12, no output voltage appears at terminal $T_2$ and the $V_{BE}$ input voltage appears across the base-emitter of follower transistor 14.

From the above it can be seen that, for the condition of substantially one $V_{BE}$ input signal (or bias), the collector currents of transistors 14, 16, 24 and 28 are all substantially equal to each other and also are equal to the current in resistor 30 ($I_{30}$). The current level of the transistors for this quiescent condition therefore may be selected by appropriate selection of the value of resistor 30.

When the input signal voltage supplied to terminal $T_1$ rises above $V_{BE}$, collector current of transistor 14 tends to increase and current flows in load resistor 12. This increase in collector current is translated via repeaters 18 and 20 and appears as an increase in the collector current of transistor 28. The total current ($I_{30}$) in resistor 30 remains approximately constant. The voltage at the collector of transistor 28, and therefore across the base-emitter of transistor 16, decreases. An amplified decrease is realized in the collector current of regulator transistor 16. The difference between the emitter current of follower transistor 14 and the collector current of regulator transistor 16 is supplied to load resistor 12 and the voltage across resistor 12 follows the input voltage variations.

In a similar manner, when the input signal again decreases towards $V_{BE}$, the collector current of transistor 14 tends to decrease. This decrease in collector current appears at the collector of transistor 28 and causes the base current of regulator transistor 16 to increase. A resulting amplified increase in collector current of transistor 16, a decrease in current in load resistor 12 and a drop in voltage across resistor 12 are then produced.

The above-described feedback loop between the collector and emitter of transistor 14 may be arranged to exhibit sufficient current gain that the collector current of transistor 14 may be considered to be substantially independent of input signal variations. The loop current gain in the illustrated embodiment is substantially determined by the gain of NPN transistor 16, rather than the current gain of the PNP devices. As is well known, the frequency response of standard, integrated NPN transistors is superior to that of integrated PNP transistors. The frequency response of the feedback circuit therefore may be made dependent upon NPN transistor characteristics as in the illustrated embodiment. The current of regulator transistor 16 varies with input signal variations such that the sum of the load circuit current and regulator transistor current is substantially constant.

It should also be noted that the input signal may vary between $V_{BE}$ and ($B^+ - V_{BE}$), the upper limit being set approximately by the relatively fixed collector voltage of follower transistor 14. Throughout this range of input signals, the current in follower transistor 14 is relatively insensitive to input signal variations and remains substantially constant. Therefore the base-emitter voltage of transistor 14 remains substantially constant and input signal variations are reproduced across load resistor 12 in a linear manner. This is to be contrasted with prior feedback follower arrangements employing simply a collector load resistor for the follower transistor. In that case, the upper signal limit is lower than that associated with the present invention because of the voltage drop across the collector load resistor.

Referring to FIG. 2 of the drawing, a modified feedback follower arrangement is shown. Circuit elements similar to those of FIG. 1 are designated by corresponding reference characters followed by a prime (′) notation.

Input signals are supplied via terminal $T_1'$ to the base of a follower transistor 14′. The emitter of follower transistor 14′ is connected to an output or load terminal $T_2'$ and to the collector of a shunt regulator transistor 16′. The emitter of regulator transistor 16′ is returned to a reference potential (ground) via terminal $T_4'$. Collector current variations of follower transistor 14′ are coupled by means of first and second current repeater arrangements 18′ and 32 to the base of regulator transistor 16′. Repeater 18′ comprises the combination of a diode-connected PNP transistor 22′ and a common emitter PNP transistor 24′ having proportionally related conduction characteristics. Similarly, current repeater 32 comprises a diode-connected PNP transistor 34 and a common emitter PNP transistor 36. The emitter of each of transistors 22′, 24′, 34 and 36 is connected to a $B^+$ terminal $T_3'$. The base-emitter circuits of the two devices of each repeater are connected in parallel. The collector of diode-connected transistor 22′ is connected to the collector of follower transistor 14′ while the collector of output transistor 24′ is connected both to the joined bases of transistors 34 and 36 and via a resistor 38 to terminal $T_4'$. The collector of output transistor 36 is coupled to a resistor 40 which, in turn is connected between the base and emitter electrodes of regulator transistor 16′.

The operation of the circuit of FIG. 2 is generally similar to that of the circuit of FIG. 1. The current in resistor 38 ($I_{38}$) is equal to the difference in voltage ($B^+ - V_{BE34}$) across the resistor ($R_{38}$). Where repeaters 28′ and 32 each provide unity current gain, the current in resistor 38 is substantially equal to the sum of the current in resistor 40 and the collector current of transistor 14′ (i.e., the sum of the collector currents of transistors 14′ and 36). The initial collector bias current of transistor 14′ is therefore dependent upon the difference between the currents in resistors 38 and 40. Those resistors 38 and 40 are therefore selected according to desired operation.

Input signal variations supplied to terminal $T_1'$ tend to vary the collector current of follower transistor 14′ and, consequently, to vary the output current of repeater 18′ in a corresponding and substantially equal manner. Since transistors 24′ and 34 are coupled in common to the substantially constant current source comprising resistor 38 and a voltage supply ($B^+ - V_{BE34}$), equal but opposite changes are produced in the collector current of output transistor 36 of repeater 32. Resultant voltage changes across resistor 40 are of the proper sense to cause compensating changes to occur in collector current of regulator transistor 16′. The collector current of follower transistor 14′ exhibits reduced dependence upon input signal variations. Consequently, the voltage provided at output terminal $T_2'$ follows, in a linear manner, the output voltage variations supplied to input terminal $T_1'$.

It should be recognized that various modifications may be made to the illustrated circuits. The combination of common emitter and diode-connected transistors may be replaced by other arrangements. For example, the various types of current repeaters described in "Handbook of Semi-conductor Electronics," edited by L. P. Hunter and published by McGraw Hill, Inc. may be employed. Furthermore, different types of load circuits other than resistive loads, for example, capacitive loads, may be driven by the illustrated follower arrangements. The conductivity of all transistors in a particular configuration may also be opposite to those illustrated. A corresponding change in supply and signal voltage polarities would then accompany such change. Additional modifications within the scope of the invention are also possible.

What is claimed is:

1. An electronic signal amplifier comprising:
   - a first transistor having base, emitter and collector electrodes,
   - means for supplying input signals to said base electrode,
   - a load circuit coupled to said emitter electrode,
   - a source of operating potential,
   - a second transistor having base, emitter and collector electrodes and arranged in a common emitter configuration,
   - means for direct current coupling said base and emitter electrodes of said second transistor between said collector of said first transistor and said source,
   - third and fourth transistors, each having base, emitter and collector electrodes and each being arranged in a common emitter configuration,
   - means for direct current coupling the base of said third transistor to the collector of said second transistor,
   - means for direct current coupling the base of said fourth transistor to the collector of said third transistor, and
   - means for coupling the collector-emitter circuit of said fourth transistor across said load circuit.

2. An electronic signal amplifier according to claim 1 wherein:
   - said first and fourth transistors are of one type conductivity and said second transistor is of opposite type conductivity.

3. An electronic signal amplifier according to claim 2 wherein:
   - said third transistor is of said opposite type conductivity and the emitter electrode of said third transistor is direct current coupled to said source.

4. An electronic signal amplifier according to claim 3 wherein:
   - said means for coupling the base of said third transistor to the collector of said second transistor comprises a resistor coupled from said last-named collector to the emitter of said fourth transistor.

5. An electronic signal amplifier according to claim 4 wherein:

said means for coupling the base of said third transistor to the collector of said second transistor further comprises a first diode-connected transistor connected between the base and emitter electrodes of said third transistor, and said means for coupling the base of said second transistor to the collector of said first transistor comprises a second diode-connected transistor connected between base and emitter electrodes of said second transistor.

6. An electronic signal amplifier according to claim 2 wherein:

said third transistor is of said one type conductivity and the emitter of said third transistor is direct current coupled to said emitter of said fourth transistor.

7. An electronic signal amplifier according to claim 6 wherein:

said means for coupling the base of said fourth transistor to the collector of said third transistor comprises a resistor coupled from said last-named collector to said source.

8. An electronic signal amplifier according to claim 7 wherein:

said means for coupling the base of said third transistor to the collector of said second transistor comprises a first diode-connected transistor connected between the base and emitter electrodes of said third transistor, and said means for coupling the base of said second transistor to the collector of said first transistor comprises a second diode-connected transistor having base and emitter electrodes connected between the base and emitter electrodes of said second transistor.

9. An electronic signal amplifier comprising:

a first transistor having base, emitter and collector electrodes, a source of operating potential having supply and reference terminals, means coupled between said base electrode and said reference terminal for supplying input signals to said first transistor, a load circuit coupled between said emitter electrode and said reference terminal, a second transistor having emitter and collector electrodes coupled across said load circuit and a base electrode, first current repeater means, including at least one transistor base-emitter junction coupled between said collector electrode and said supply terminal and a third transistor having base and emitter electrodes coupled to corresponding electrodes of said one transistor and a collector electrode for producing feedback current proportional to collector current of said first transistor, and means coupled to said first current repeater means and responsive to said feedback current for providing control signals between said base and emitter electrodes of said second transistor so as to reduce variations of collector current of said first transistor caused by said input signals while coupling sufficient current to said load circuit to reproduce variations in said input signal across said load circuit.

10. An electronic signal amplifier according to claim 9 wherein:

said means for providing control signals comprise second current repeater means having an input coupled to said first current repeater means and an output coupled to said base electrode of said second transistor.

11. An electronic signal amplifier comprising:

a first transistor having base, emitter and collector electrodes, a source of operating potential having supply and reference terminals, means coupled between said base electrode and said reference terminal for supplying input signals to said first transistor, a load circuit coupled between said emitter electrode and said reference terminal, first current repeater means, including at least one transistor base-emitter junction coupled between said collector electrode and said supply terminal, for producing feedback current proportional to collector current of said first transistor, a second transistor having emitter and collector electrodes coupled across said load circuit and a base electrode, and means comprising a second current repeater means, having an input coupled to said first current repeater means and an output coupled to said base electrode of said second transistor, responsive to said feedback current for providing control signals between said base and emitter electrodes of said second transistor so as to reduce variations of collector current of said first transistor caused by said input signals while coupling sufficient current to said load circuit to reproduce variations in said input signals across said load circuit, said first and second current repeater means each including at least two transistors having base-emitter junctions connected in parallel in which input current is supplied and an output collector electrode from which output current proportional to said input current is provided, said two transistors of each said repeater means exhibiting proportionally related conduction characteristics.

12. An electronic signal amplifier according to claim 11 wherein:

said first and second transistors are of a first type conductivity and said two transistors of said first current repeater means are of a second type conductivity.

13. An electronic signal amplifier according to claim 12 wherein:

said two transistors of said second current repeater means are of said first type conductivity and include emitter electrodes connected to said reference terminal, and said two transistors of said first current repeater means each include emitter electrodes direct current coupled to said supply terminal and base electrodes direct current coupled to said collector of said first transistor.

14. An electronic signal amplifier according to claim 13 wherein:

one of said two transistors in each of said first and second current repeater means is connected as a diode.

15. An electronic signal amplifier according to claim 14 and further comprising:

a resistor coupled between said potential source terminal and one of said output collector electrodes, said resistor being further coupled to said base electrode of said second transistor.

* * * * *